(12) United States Patent
Weber

(10) Patent No.: US 9,491,876 B2
(45) Date of Patent: Nov. 8, 2016

(54) VIDEO DISPLAY DEVICE

(71) Applicant: Richard L. Weber, Downingtown, PA (US)

(72) Inventor: Richard L. Weber, Downingtown, PA (US)

(73) Assignee: Vpak Technology, Downington, PA (US)

(*) Notice: Subject to any disclaimer, the term of this patent is extended or adjusted under 35 U.S.C. 154(b) by 0 days.

(21) Appl. No.: 13/758,434

(22) Filed: Feb. 4, 2013

(65) Prior Publication Data

US 2014/0219626 A1    Aug. 7, 2014

(51) Int. Cl.
*H04N 5/77* (2006.01)
*G09G 5/00* (2006.01)
*H05K 5/03* (2006.01)
*G06F 1/16* (2006.01)

(52) U.S. Cl.
CPC ............... *H05K 5/03* (2013.01); *G06F 1/1616* (2013.01); *G06F 1/1677* (2013.01); *G06F 2200/1634* (2013.01)

(58) Field of Classification Search
CPC ... G06F 3/0483; G11B 31/006; H04N 5/775; H04N 5/44573
USPC ...... 386/358, 362; 455/566, 575.1; 345/156, 345/173, 619; 715/716, 776; 361/679.3
See application file for complete search history.

(56) References Cited

U.S. PATENT DOCUMENTS

| | | |
|---|---|---|
| 6,421,524 B1 * | 7/2002 | Padgett .......................... 434/317 |
| 7,127,841 B1 | 10/2006 | Weber |
| D612,418 S | 3/2010 | Kenney |
| 7,802,386 B2 | 9/2010 | Mandelbaum |
| D627,820 S | 11/2010 | Oyama |
| D629,459 S | 12/2010 | Clegg |
| D632,330 S | 2/2011 | Qiao |
| 8,011,122 B2 | 9/2011 | Clegg |
| D654,113 S | 2/2012 | Clegg |
| 8,138,869 B1 | 3/2012 | Lauder |
| 2004/0197758 A1 * | 10/2004 | Langford ....................... 434/317 |
| 2005/0104848 A1 * | 5/2005 | Yamaguchi et al. ........... 345/156 |
| 2005/0260551 A1 | 11/2005 | Rubin |
| 2006/0079277 A1 * | 4/2006 | Ditzik .......................... 455/556.1 |
| 2006/0183505 A1 * | 8/2006 | Willrich ........................ 455/566 |
| 2007/0039215 A1 | 2/2007 | Sheridan |
| 2009/0211126 A1 | 8/2009 | Oh |
| 2009/0238544 A1 | 9/2009 | Orsini |
| 2009/0249206 A1 * | 10/2009 | Stahlberg ....................... 715/716 |
| 2010/0164836 A1 | 7/2010 | Liberatore |
| 2011/0247247 A1 | 10/2011 | Mayer |
| 2011/0296334 A1 * | 12/2011 | Ryu et al. ..................... 715/776 |
| 2013/0328914 A1 * | 12/2013 | Smith et al. .................. 345/619 |
| 2014/0124388 A1 * | 5/2014 | McGowan et al. ............. 206/37 |

\* cited by examiner

*Primary Examiner* — Thai Tran
*Assistant Examiner* — Mishawn Hunter
(74) *Attorney, Agent, or Firm* — Fish & Richardson P.C.

(57) ABSTRACT

A device includes a housing body that has a top surface, a bottom surface, and an edge portion, where the housing body also houses a display screen. The device further includes a cover panel that has an inner surface and an outer surface, where the cover is pivotally attached to the edge portion of the housing body to move between a closed position that covers the display screen and an open position that uncovers the display screen. The cover panel includes a fold-out element that is attached to the inner surface of the cover panel and that is configured to open outward away from the display screen when the cover panel is in the open position.

8 Claims, 9 Drawing Sheets

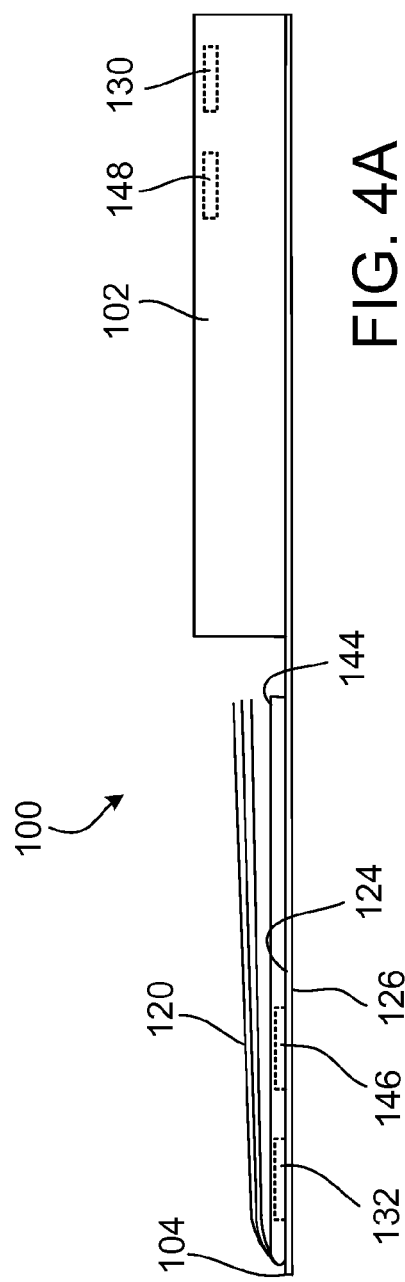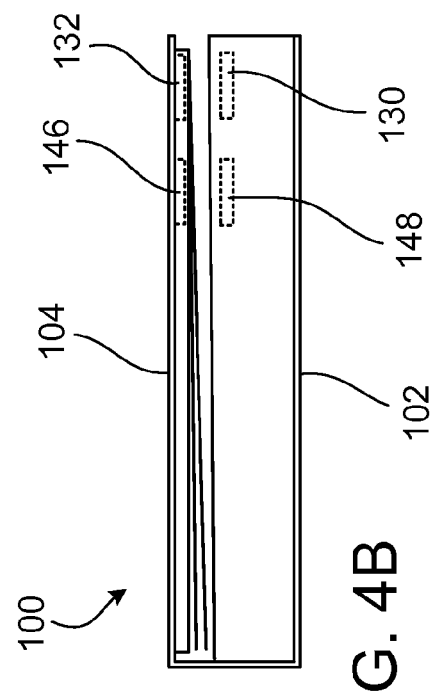

VIDEO DISPLAY DEVICE

TECHNICAL FIELD

This description relates to a device for displaying video.

BACKGROUND

Effective and cost-efficient communications with people can be challenging because of the busy schedules that people maintain. For example, when making a sales call about a product, sales representatives are frequently unable to get their marketing message to the customer because of the customer's busy schedule and because some customers refuse to meet in-person with a sales representative.

SUMMARY

According to one aspect, a device includes a housing body having a top surface, a bottom surface, and an edge portion, wherein the housing body houses a display screen, and a cover panel having an inner surface and an outer surface. The cover panel is pivotally attached to the edge portion of the housing body to move between a closed position that covers the display screen and an open position that uncovers the display screen. The cover panel further includes a fold-out element attached to the inner surface of the cover panel and configured to open outward away from the display screen when the cover panel is in the open position.

Implementations of this aspect may include one or more of the following features. For example, the housing body may further house a first magnet at a first location, and the cover panel may further comprise a second magnet disposed between the inner surface of the cover panel and the fold-out element at a second location. When the cover panel is in the closed position, the first magnet and the second magnet may attract each other to magnetically latch the cover panel to the housing body. The cover may further comprise a third magnet disposed between the inner surface of the cover panel and the fold-out element at a third location spaced apart from the second location. The housing body may further comprise a magnetically sensitive element at a fourth location spaced apart from the first location. The magnetically sensitive element may be configured to detect a change in a magnetic field of the third magnet. The display screen may be activated when the magnetically sensitive element detects a change in the magnetic field coming from the third magnet. The change in the magnetic field may result from the movement of the cover panel from the closed position to the open position. The magnetically sensitive element may comprise a Hall effect sensor. The display screen may take up a majority of the top surface of the housing body. The display screen may take up between 51% and 60% of the top surface of the housing body. The display screen may take up between 61% and 75% of the top surface of the housing body. The housing body may have an outer edge portion opposite from the edge portion. The cover panel may have an inner edge and an outer edge opposite from the inner edge, and the inner edge of the cover panel may be pivotally attached to the edge portion of the housing body. The first magnet may be positioned proximate the outer edge portion of the housing body, and the second magnet may be positioned proximate the outer edge of the cover panel. The cover panel may have an inner edge and an outer edge opposite from the inner edge. The inner edge of the cover panel may be pivotally attached to the edge portion of the housing body, and a pivot axis of the fold-out element may be substantially aligned with the outer edge of the cover panel. The fold-out element may comprise a low tack strip configured to removably hold a business card. The device may comprise a business card that may be removably attached to the low tack strip. The fold-out element may comprise a holder that defines an area configured to hold various items therein. The housing body may further house a speaker. The bottom surface of the housing body may define one or more speaker openings. The top surface of the housing body may define one or more speaker openings. The fold-out element may include two or more pages that fold out away from the display screen. The device may comprise a recording module that may be configured to removably couple to the housing body. The recording module may comprise a camera portion configured to couple to the housing body and a separate controller that may include a microphone and a recording button.

According to another aspect, a method for displaying a video on a display screen includes providing a housing body that houses the display screen, opening a cover panel that is pivotally attached to an inner edge portion of the housing body to reveal the display screen, and displaying the video on the display screen when a magnetically sensitive element housed in the housing body detects a first change in a magnetic field coming from a sensor magnet attached to the cover panel. The cover panel is initially at a closed position in which the cover panel is magnetically latched to the housing body via a pair of corresponding latching magnets. The first change in the magnetic field results from the opening of the cover panel.

Implementations of this aspect may include one or more of the following features. For example, the method may further comprise closing the cover panel such that the magnetically sensitive element may detect a second change in the magnetic field coming the sensor magnet. Upon detection of the second change in the magnetic field corresponding to the closed position of the cover panel, the video display may be stopped. The method may further comprise attaching a recording module to the housing body. The recording module may comprise a camera portion and a separate controller that may include a microphone and a recording button. The method may further comprise pressing the recording button and capturing a desired video and audio.

According to yet another aspect, a method for displaying a video on a display screen includes providing a housing body that houses the display screen, opening a cover panel that is pivotally attached to an edge portion of the housing body to reveal the display screen, displaying a first video on the display screen when a sensing element housed in the housing body detects an opening of the cover panel, displaying a second video on the display screen upon detecting that a first switch has been pressed and released without holding for greater than a preset amount of time, and displaying a video of a next chapter of videos on the display screen upon detecting that the first switch has been pressed and released after holding for greater than the preset amount of time. The cover panel is initially at a closed position in which the cover panel is latched to the housing body.

The details of one or more implementations are set forth in the accompanying drawings and the description below. Other features, aspects, and advantages will become apparent from the description, the drawings, and the claims. Implementations of the techniques discussed above may include a method or process, a system or apparatus, or computer software on a computer-accessible medium.

DESCRIPTION OF DRAWINGS

FIGS. 4A and 4B are bottom views of the display device in an open position and a closed position, respectively.

Like reference symbols in the various drawings indicate like elements.

DETAILED DESCRIPTION

Figure 1:
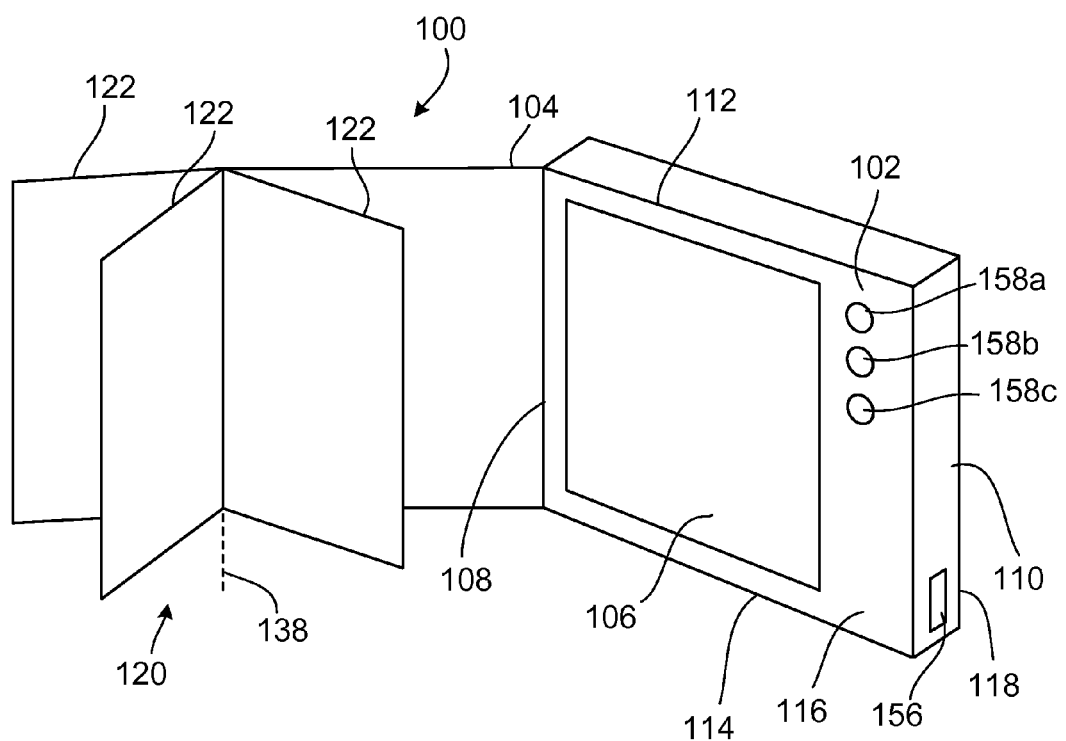
FIG. 1 is perspective view of a display device.

Referring to FIG. 1, a display device 100 includes a housing body 102 and a cover panel 104. The housing body 102 can have a box-like structure and houses a display screen 106. The body 102 includes an inner edge portion 108, an outer edge portion 110, a top edge portion 112, and a bottom edge portion 114. The body 102 also includes a front surface 116 and a rear surface 118. The display screen 106 can be viewed through the front surface 116 and can take up a majority of, i.e. over half of, a surface area of the front surface 116. In some cases the display screen 106 can take up between 61% and 75% of the surface area. In some cases the display screen 106 can take up over 75% of the surface area.

The cover panel 104 can be attached to an edge portion, such as inner edge portion 108, of the housing body 102 such that the cover panel 104 and the body 102 form a card-type structure that can open and close to reveal the display screen 106. As illustrated in the exemplary implementation of FIG. 1, the cover panel 104 is pivotally attached to the inner edge portion 108 of the body 102. The cover panel 104 can be made from paper, heavy card stock, or cardboard-type material, just to name a few.

In one implementation, the cover panel 104 includes a fold-out element 120. The fold-out element 120 can be in the form of a booklet having one or more pages 122 and is configured to open outward away from the display screen 106 when the cover panel 104 is in an open position, as shown in FIG. 1. For example, the one or more pages 122 of the fold-out element 120 can open from right to left such that turning the pages does not impede a user's view of the display screen 106 (see FIG. 1). In some cases, the fold-out element 120 may open from bottom to top, or in other cases, vice versa.

Figure 2A:
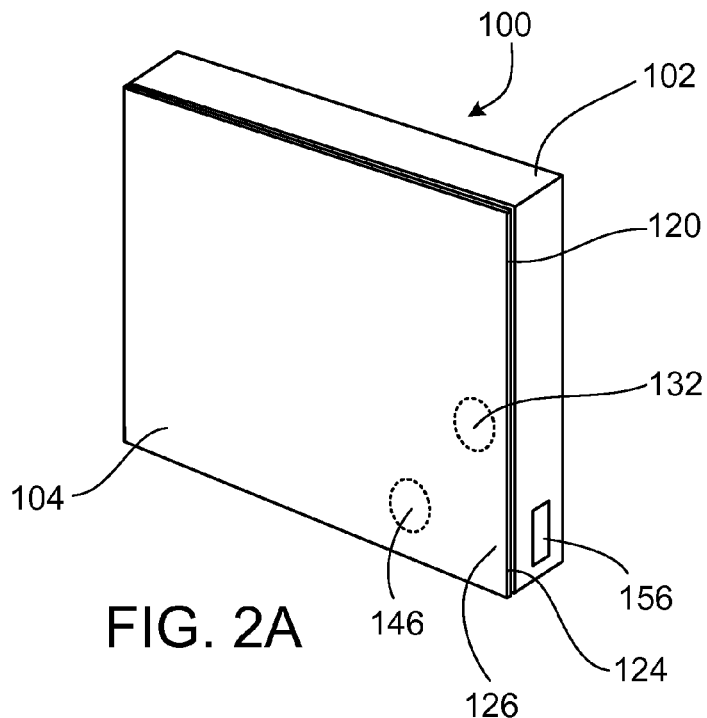
FIGS. 2A and 2B are front perspective views of the display device in a closed position and an open position, respectively.
Figure 2B:
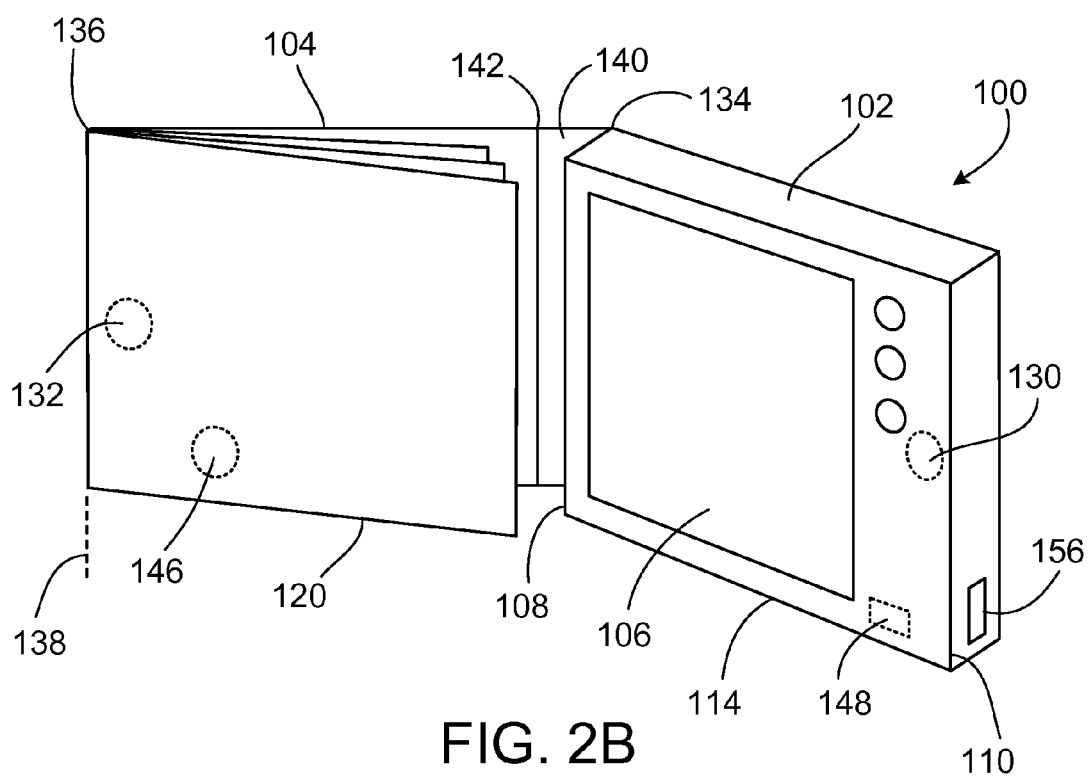

Referring also to FIGS. 2A and 2B, the display device 100 is shown with the cover panel 104 in a closed position (FIG. 2A) and in an open position (FIG. 2B). In the closed position, the fold-out element 120 is sandwiched between an inner surface 124 of the cover panel 104 and the front surface 116 of the housing body 102. Additionally, all or a portion of the display screen 106 is covered by the cover panel 104. As described further below, first and second latching magnets 130, 132 can help keep the cover panel 104 in the closed position by magnetically latching the cover panel 104 to the body 102. Customized text and/or graphics can be affixed, or in some cases directly printed, to an outer surface 126 of the cover panel 104. In some cases, the cover panel 104 may be maintained in the closed position without the aid of latching magnets 130, 132. In some cases, the cover panel 104 may be maintained in the closed position using mechanical latching elements, such as a biased hinge region or a hook and loop fastener, among others.

Figure 3:
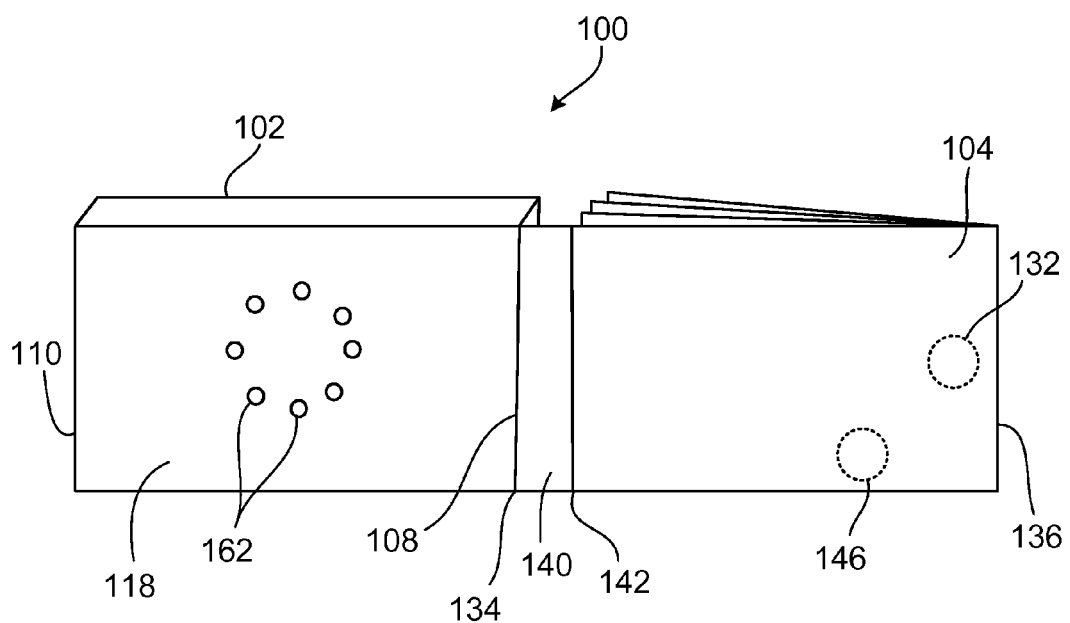
FIG. 3 is a rear perspective view of the display device.

As described above, the cover panel 104 is pivotally attached to the housing body 102 such that the cover panel 104 can open and close. Referring also to FIG. 3, the cover panel 104 can have an inner edge 134 that is pivotally attached to the inner edge portion 108 of the body 102. In some cases, as shown in FIG. 3, the cover panel 104 can be attached to a rear of the inner edge portion 108 such that the cover panel 104 forms a continuous surface with the rear surface 118 of the body 102. Alternatively, the cover panel 104 can be attached to a front of the inner edge portion 108 such that cover panel 104 forms a continuous surface with the front surface 116 of the body 102. The cover panel 104 can have an outer edge 136 that is opposite the inner edge 134. A pivot axis 138 of the fold-out element 120 can be generally aligned with the outer edge 136 as shown in FIG. 2B.

When the cover panel 104 is pivotally attached to the rear of the inner edge portion 108 and forms a continuous surface with the rear surface 118, as illustrated in FIGS. 2B and 3, the cover panel 104 can have a pivot section 140 and a folding point 142 between the pivot section 140 and the rest of the cover panel 104 such that the cover panel 104 can wrap around the inner edge portion 108 (see FIG. 4B). In some cases, the cover panel 104, the pivot section 140, and the rear surface 118 can be made from a single continuous piece of, for example, paper, heavy card stock, or cardboard-type material. In some cases, the cover panel 104, the pivot section 140, and the rear surface 118 can be made from two or more pieces of material that are attached to each other, for example, via adhesive.

Referring again to FIG. 2B, the device 100 includes a first latching magnet 130 in the body 102 at a first location (shown in dotted line) and a second latching magnet 132 in the cover panel 104 at a second location (shown in dotted line). As further illustrated in FIGS. 4A and 4B, the second magnet 132 in the cover panel 104 can be disposed between the inner surface 124 of the cover panel and a last page 144 of the fold-out element 120. In some cases, the last page 144 of the element 120 can be a separate sheet that is attached, for example via adhesive, to the inner surface 124 and the element 120. The first and second locations of the first and second magnets 130, 132, respectively, are selected to enable magnetic latching of the cover panel 104 to the housing body 102. For example, the first and second locations can be chosen so that when the cover panel 104 is in the closed position, the first and second magnets 130, 132 are substantially vertically or linearly aligned (see FIG. 4B). In some cases, the first and second magnets 130, 132 are disposed adjacent to, respectively, the outer edge portion 110 of the body 102 and the outer edge 136 of the cover panel 104, thereby maximizing a lateral distance between the pivotally attached portion of the cover panel 104 and the first and second magnets 130, 132. By maximizing this lateral distance, an external moment required to open the cover panel 104 can be maximized. In some cases, the first and second magnets 130, 132 can cause the cover panel 104 to snap close as the cover panel 104 moves from the open position toward the closed position. In some cases, the first and second magnets 130, 132 can help correct any folding misalignment between the housing body 102 and the cover panel 104 by providing a lateral restoring force between the two axially-aligned magnets.

Referring to FIGS. 2A-4B, the cover panel 104 can include another magnet, namely a sensor magnet 146, that is disposed between the inner surface 124 of the cover panel and a last page 144 of the element 120. The body 102 can further house a magnetically sensitive element 148 at a location that corresponds to that of the sensor magnet 146 so that when the cover panel 104 is in the closed position, the magnetically sensitive element 148 can detect a magnetic field coming from the sensor magnet 146. For example, the sensor magnet 146 and the magnetically sensitive element 148 can be substantially vertically or linearly aligned when the cover panel 104 is in the closed position (see FIG. 4B). In some cases, the magnetically sensitive element 148 can be a Hall effect sensor or a magnetic reed switch. In some cases, other sensing elements, such as a mechanical sensor or a light sensor may be used in lieu of the magnetically sensitive element 148.

In use, when the cover panel 104 is moved from the closed position to the open position, the magnetically sensitive element 148 can detect a corresponding change in the magnetic field of the sensor magnet 146. In response, the magnetically sensitive element 148 can trigger activation of, for example, the display screen 106 and/or other electronic components within the housing 102. Conversely, the magnetically sensitive element 148 can trigger turning off of the display screen 106 and/or other electronic components within the housing 102 when it senses a change in the magnetic field of the sensor magnet 146 corresponding to the closing of the cover panel 104. A distance between the magnetically sensitive element 148 and the first latching magnet 130, both of which are housed within the housing body 102, should be selected so that a magnetic field coming from the first latching magnet 130 does not substantially affect the magnetically sensitive element 148 or so that it can be substantially calibrated out. For example, as shown in FIG. 2B, the first latching magnet 130 can be positioned proximate the outer edge portion 110 while the magnetically sensitive element 148 can be positioned away from the first latching magnet 130 and proximate the bottom edge portion 114.

Figure 5:
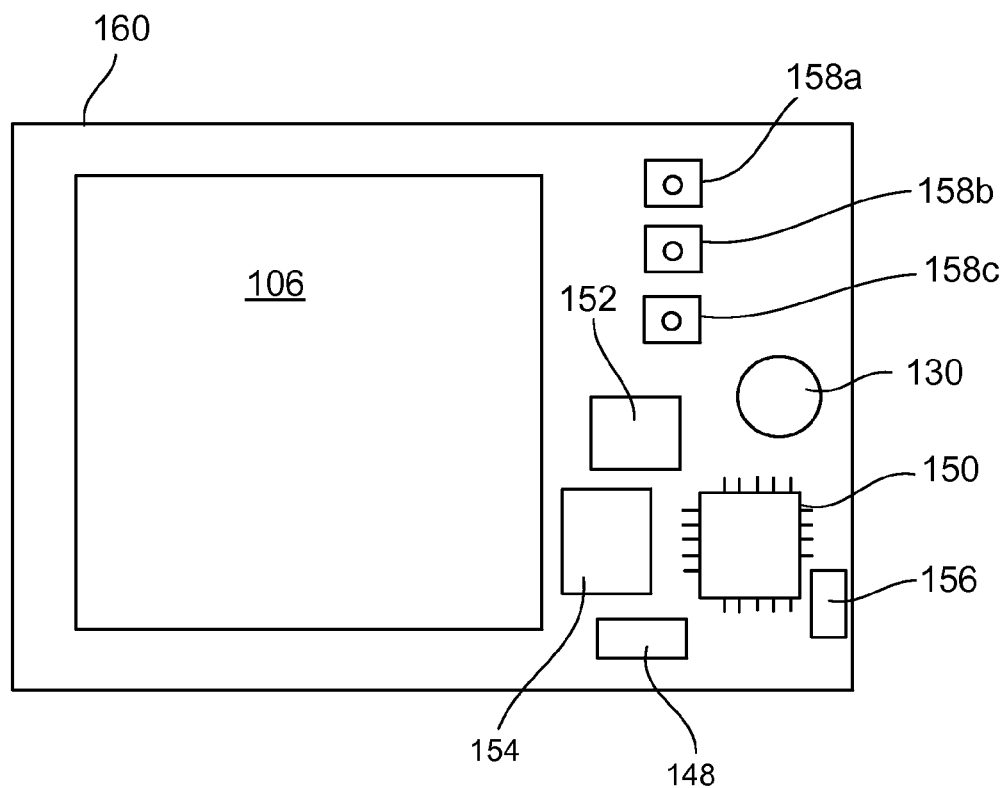
FIG. 5 illustrates various internal components housed within a body of the display device.

Referring to FIG. 5, the housing body 102 can include the display screen 106 as well as other electronic components that allow the device 100 to, for example, store, play, and/or record various video as well as audio messages. For example, the body 102 can house the magnetically sensitive element 148, a processor 150, a memory 152, a power source 154, power/data port 156, and one or more switches 158a-c. In some cases, a speaker (not shown) may be located behind the display screen 106. In such cases, the rear surface 118 of the housing body 102 may define one or more speaker openings 162 that are positioned proximate the speaker (see FIG. 3). The power source 154 can include a rechargeable power source, for example, a rechargeable lithium-ion battery. The power/data port 156 can include a universal serial bus (USB) port or other suitable port and may be used to both upload/download data as well as recharge the power source 154. The various electronic components as shown in FIG. 5 may be placed on a breadboard 160. In some cases, the electronic components may be encapsulated in a moisture-proof material to help prevent damage from water and/or shock. In some implementations, the body 102 may further house a microphone, video camera, and/or other components that enable the device 100 to directly record audio and/or video messages without using an external input device. In some cases, the display screen 106 may be a touchscreen display which could eliminate the need for the switches 158a-c.

In an alternative implementation, the one or more switches 158a-c, as also shown in FIG. 1, may be utilized to give the user further control over a video/audio message being presented by the device 100. For example, the one or more switches 158a-c may be used to perform a variety of user-controlled functions including, but not limited to, pause, resume, skip ahead/back, rewind, fast forward, move to next/previous track/chapter, record, volume up/down, brightness/contrast up/down, and etc. In some cases, the display screen 106 may be activated by first opening the cover panel 104 and then pressing the one or more switches 158a-c. In some cases, the display screen 106, when activated, may initially display an introductory image. The introductory image may be displayed for a preset amount of time or may be displayed until one or more switches 158a-c are pressed by the user. The introductory image can include a welcome screen, a status screen, a table of contents, a personal message for the user, etc.

Each of the switches 158a-c, which can include mechanical, capacitive, and other types of switches, may be programmed by the user to have one or more desired functions. In one example implementation, pressing and quickly releasing, for example within 2 seconds, the switch 158a can advance to the next video, pressing and quickly releasing the switch 158b can go back to the previous video, and pressing and quickly releasing the switch 158c can pause/resume the video. Additionally, pressing and holding, for example for more than 2 seconds, the switch 158a can increase the volume, pressing and holding the switch 158b can decrease the volume, and pressing and holding the switch 158c can reset video content or turn off the display. In some cases, pressing and holding the switch 158a, b can continue to increase/decrease the volume until the switch 158a, b is released.

In another example implementation, pressing and quickly releasing the switch 158a can advance to the next video while pressing and holding the switch 158a can advance to a next chapter, where a chapter contains one or more videos. Similarly, pressing and quickly releasing the switch 158b can go back to the previous video while pressing and holding the switch 158b can go back to a previous chapter. Pressing and releasing the switch 158c can pause/resume the video while pressing and holding the switch 158c can reset video content, for example to the first video of the first chapter. In some cases, pressing and holding the switch 158c can cause a function of another switch to reverse. For example, if the device 100 has only switches 158a and 158c, where switch 158a possesses the advance to next video/chapter function as just described, pressing, holding for more than 2 seconds, and releasing the switch 158c can cause the function of the switch 158a to reverse such that pressing and releasing the switch 158a goes back to the previous video while pressing and holding the switch 158a goes back to the previous chapter. The switch 158c may be pressed, held, and released again to return the switch 158a to its original function.

Figure 6A:
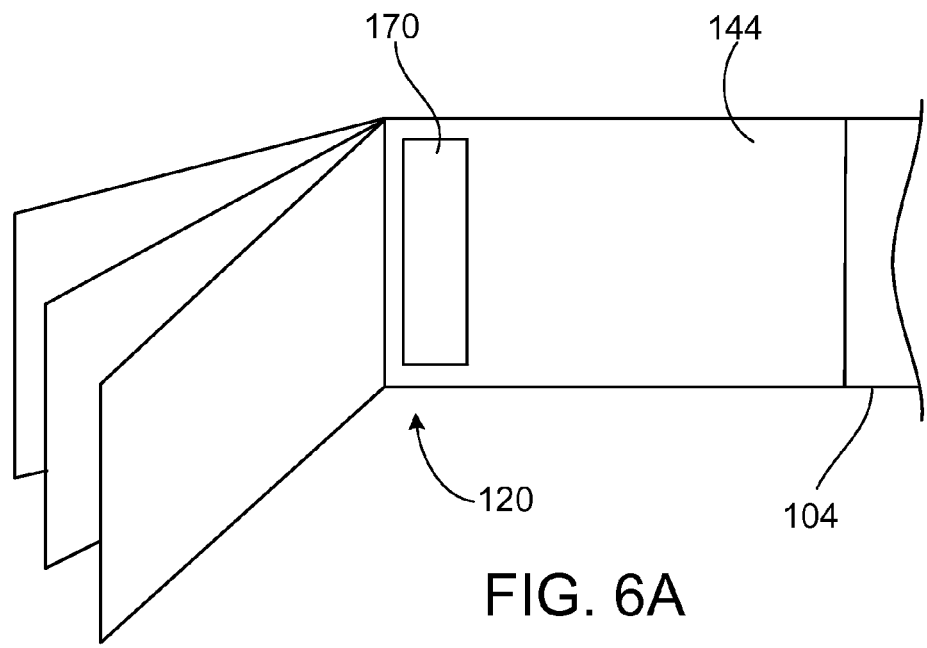
FIGS. 6A and 6B are partial perspective views of the display device.
Figure 6B:
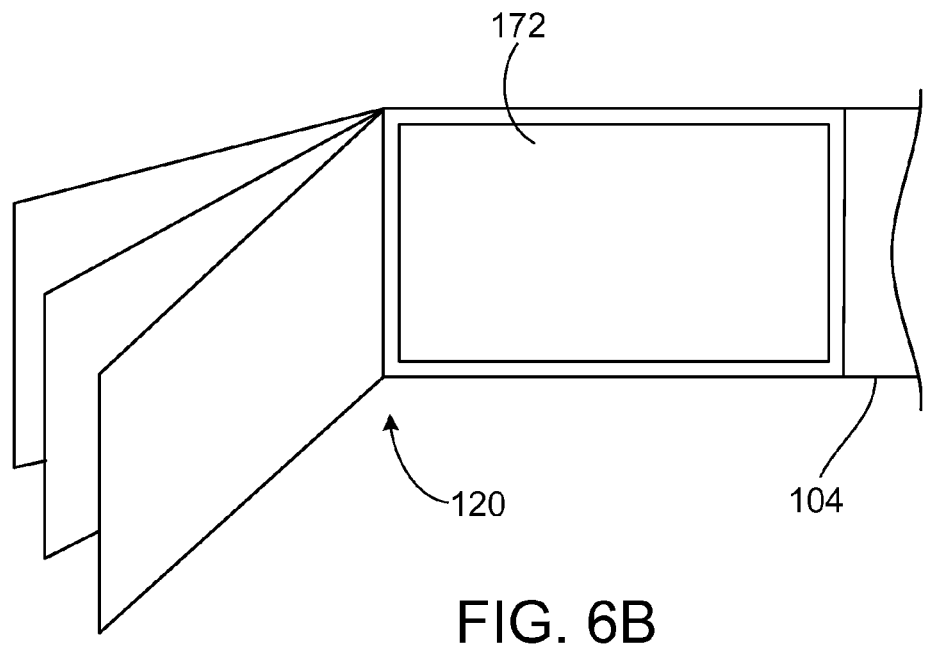

Referring to FIGS. 6A and 6B, the fold-out element 120 affixed to the cover panel 104 can include a portion that is designed to removably hold, among other things, a business card. For example, the last portion 144 can include a low-tack adhesive strip 170 that allows a user to attach a business card 172. The cover panel 104 can be sized and shaped to allow a standard business card, which typically measures approximately 3.5 inches by 2 inches, to fit within its edges. The business card 172 attached to the fold-out element 120 via the low-tack strip 170 may be easily removed without causing damage to either the fold-out element 120 or the business card 172. Likewise, the business card 172 may be reattached to the strip 170 if desired.

Figure 7:
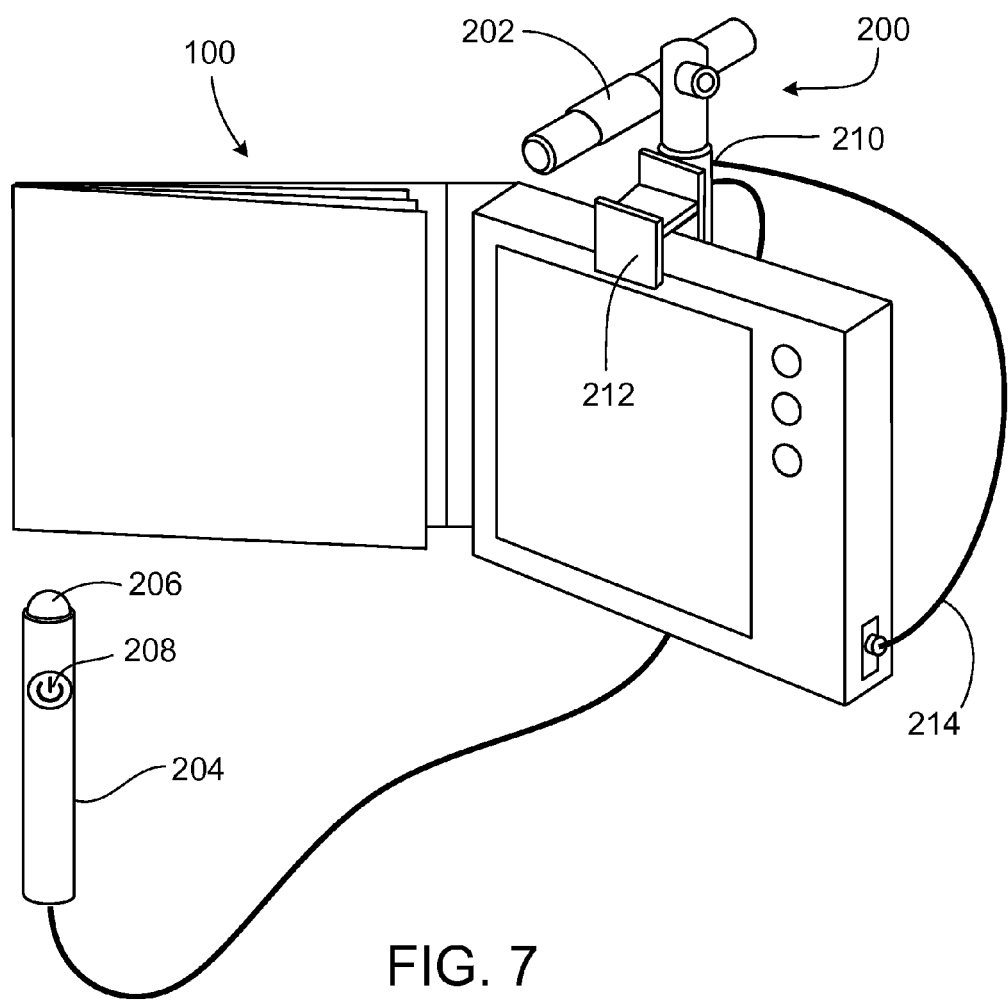
FIG. 7 is a perspective view of the display device and a recording module.

In one implementation, the user may upload a desired video/audio message from a computer (not shown) to the device 100 via the port 156. Alternatively, as illustrated in FIG. 7, a recording module 200 may be used to directly record the desired video/audio message onto the device 100. The ability to directly record on the device 100 can allow the user to, for example, easily and quickly create customized messages without having to rely on bulky external equipment.

Referring to FIG. 7, an exemplary recording module 200 includes a camera 202 and a controller 204. The controller 204 can include a microphone 206 and a recording button 208. The camera 202 can be adjustably attached, for example via a swivel unit, to an attachment portion 210, and the attachment portion 210 can removably couple to the device 100 via a clamp 212.

In use, the user can secure the recording module 200 to the device 100 by coupling the clamp 212 to the device, for example, at the top edge portion 112 and by connecting a wire 214 to the port 156. The device 100 may include markings that correspond to a preferred location for coupling the clamp 212 thereto. The camera 202 can be swiveled toward the user to record, for example, a personalized video message featuring the user, or the camera can be swiveled away from the user to record, for example, a video of a product, event, or surrounding as viewed by the user. When ready to record, the user may press the recording button 208 on the controller 204, after which the user may capture the desired video via the camera 202 and the desired audio via the microphone 206. The user may again press the button 208 to stop recording and save the captured message on the device 100.

Figure 8:
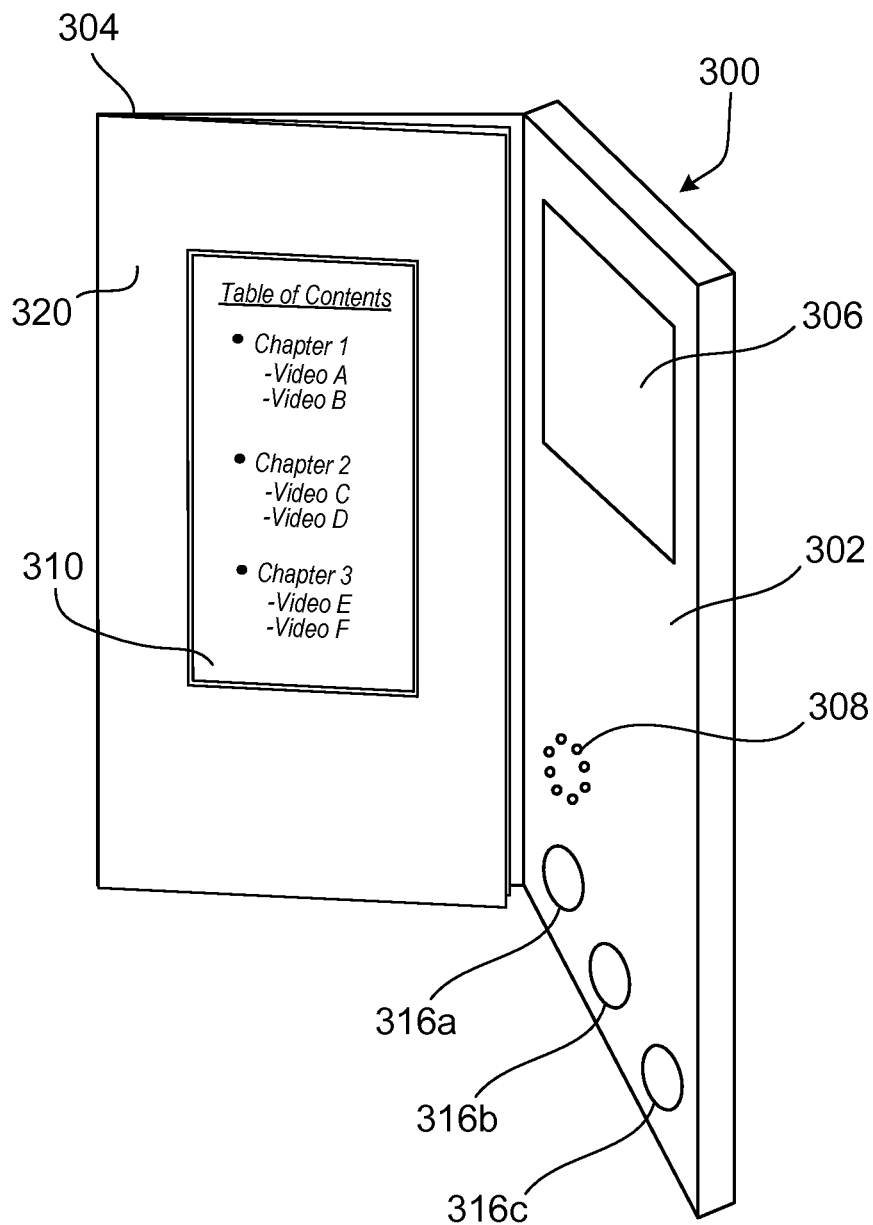
FIG. 8 is a perspective view of an alternative of the display device.
Figure 9:
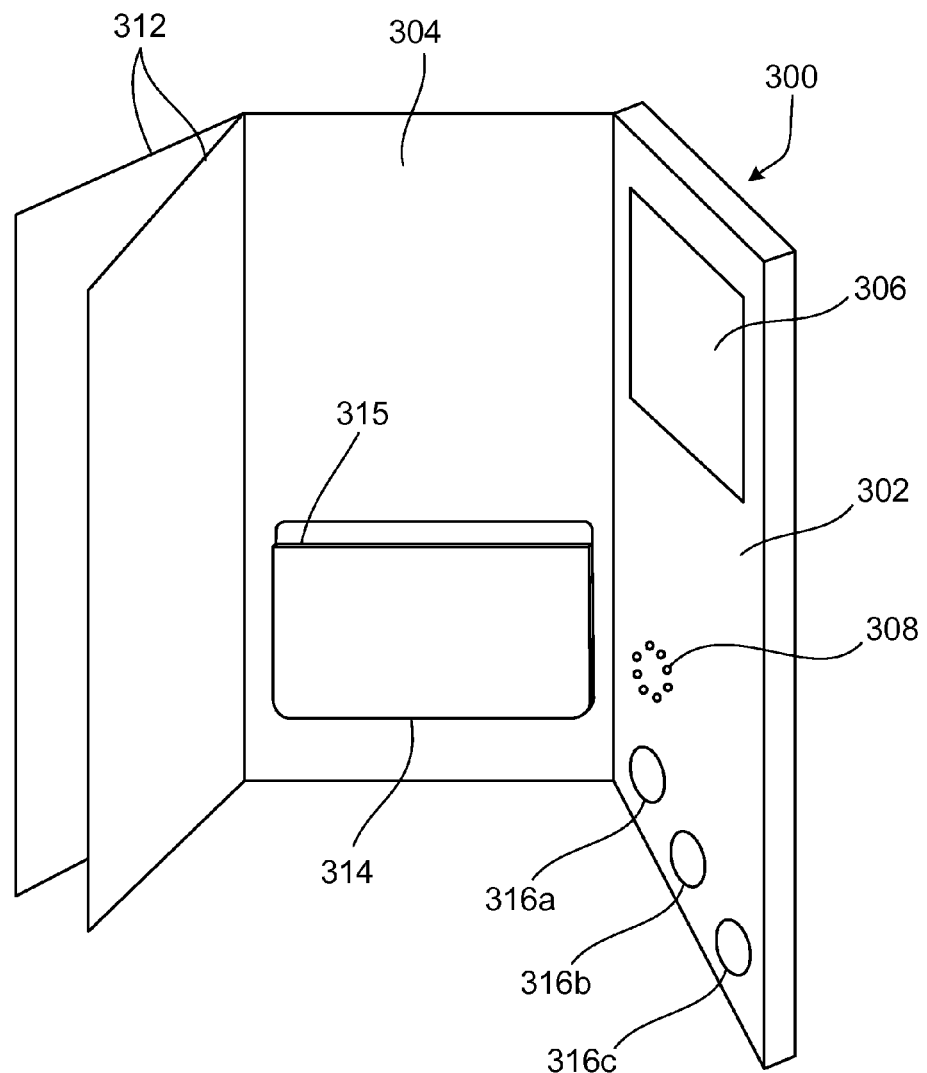
FIG. 9 is another perspective view the display device of FIG. 8.

Referring to FIGS. 8 and 9, in an alternative implementation, a display device 300 includes a body 302 and a cover 304. The body 302 can have a box-like structure and houses a display screen 306. The cover 304 is pivotally attached to an edge portion of the body 302 and can be in the form of a fold-out element 320. In some cases, the fold-out element 320 can be a booklet having one or more pages 312 (FIG. 9). A footprint of the display device 300 may be significantly larger than a standard business card and can measure, for example, 5 inches by 7 inches or 6.5 inches by 9 inches. Speaker openings 308 may further be defined by a surface of the body 302, for example, its top surface.

In use, the display device 300 may function in much the same way as the device 100 of the previous example. For example, the device 300 may utilize the various latching and sensing implementations as described above with regard to the device 100. Additionally, the display device 300 can include one or more switches 316a-c that perform similar functions as switches 158a-c described above. As a non-limiting example, pressing and quickly releasing the switch 316a can advance to the next video while pressing and holding the switch 316a can advance to a next chapter. Similarly, pressing and quickly releasing the switch 316b can go back to the previous video while pressing and holding the switch 316b can go back to a previous chapter. Pressing and releasing the switch 316c can pause/resume the video while pressing and holding the switch 316c can reset video content, for example to the first video of the first chapter. In some cases, pressing and holding the switch 316c can cause a function of another switch to reverse. For example, if the device 100 has only switches 316a and 316c, where switch 316a possesses the advance to next video/chapter function as just described, pressing, holding for more than 2 seconds, and releasing the switch 316c can cause the function of the switch 316a to reverse such that pressing and releasing the switch 316a goes back to the previous video while pressing and holding the switch 316a goes back to the previous chapter. The switch 316c may be pressed, held, and released again to return the switch 316a to its original function.

As shown in FIG. 8, the fold-out element 320 can include a table of contents page 310 that corresponds to the video content stored in the device 300. For example, the table of contents page 310 can list the chapters as well as videos contained within each of the chapters to assist the user in efficiently navigating through the various videos. The table of contents page 310 may be updated as needed to reflect corresponding changes that are subsequently made to video content. In some cases, the table of contents page 310 may be detachable and/or separately replaceable.

As shown in FIG. 9, the cover 304 can include a holder or pocket 314 that may be affixed, for example, to an inside face of the cover 304. The holder 314 can include an area 315 adapted to hold various items including, but not limited to, coupons, gift certificates, tickets, notes, pamphlets, brochures, optical discs, and others. The holder 314 may be made of a clear material, for example see-through plastic, such that any item placed within the area 315 may be visually perceivable. In some cases, the holder 314 may be made of a paper-like material, such as paper, heavy paper, cardboard, card stock, and etc.

While this document contains many specific implementation details, these should not be construed as limitations on the scope of any implementations or of what may be claimed, but rather as descriptions of features specific to particular implementations of particular implementations. Certain features that are described in this document in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Thus, particular implementations of the subject matter have been described. Other implementations are within the scope of the following claims.

What is claimed is:

1. A method for displaying a video on a display screen, comprising:

opening a cover panel that is pivotally attached to an inner edge portion of a housing body that houses the display screen to reveal the display screen, the cover panel having an inner edge and an outer edge opposite from the inner edge, the inner edge of the cover panel being pivotally attached to the edge portion of the housing body, the cover panel being initially at a closed position in which the cover panel is magnetically latched to the housing body via a pair of corresponding latching magnets, a fold-out element being attached to an inner surface of the cover panel and configured to be positioned between the inner surface of the cover panel and the display screen when the cover panel is in the closed position and to open outward away from the display screen when the cover panel is in an open position, the fold-out element including two or more pages that fold out away from the display screen, a pivot axis of the fold-out element being substantially aligned with the outer edge of the cover panel, wherein opening the cover panel controls the video to be displayed on the display screen based on a magnetically sensitive element housed in the housing body detecting a first change in a magnetic field coming from a sensor magnet attached to the cover panel, the first change in the magnetic field resulting from the opening of the cover panel;

displaying a second video on the display screen upon detecting that a first switch has been pressed and released without holding for greater than a preset amount of time; and displaying a video of a next chapter of videos on the display screen upon detecting that the first switch has been pressed and released after holding for greater than the preset amount of time.

2. The method of claim 1, further comprising closing the cover panel such that the magnetically sensitive element detects a second change in the magnetic field coming from the sensor magnet, wherein upon detection of the second change in the magnetic field corresponding to the closed position of the cover panel, the video display is stopped.

3. The method of claim 1, further comprising attaching a recording module to the housing body, wherein the recording module comprises a camera portion and a separate controller that includes a microphone and a recording button.

4. The method of claim 3, further comprising pressing the recording button and capturing a desired video and audio.

5. A method for displaying a video on a display screen, comprising:

providing a housing body that houses the display screen;

opening a cover panel that is pivotally attached to an edge portion of the housing body to reveal the display screen, the cover panel being initially at a closed position in which the cover panel is latched to the housing body;

displaying a first video on the display screen when a sensing element housed in the housing body detects an opening of the cover panel;

displaying a second video on the display screen upon detecting that a first switch has been pressed and released without holding for greater than a preset amount of time; and displaying a video of a next chapter of videos on the display screen upon detecting that the first switch has been pressed and released after holding for greater than the preset amount of time.

6. The method of claim 5, further comprising closing the cover panel, wherein based on the sensing element detecting a closing of the cover panel, video display is stopped.

7. A method for displaying a video on a display screen, comprising:

displaying a first video on the display screen when a sensing element housed in a housing body that houses the display screen detects an opening of a cover panel, the cover panel being pivotally attached to an edge portion of the housing body such that the display screen is revealed when the cover panel is in an open position, the cover panel being initially at a closed position in which the cover panel is latched to the housing body;

displaying a second video on the display screen upon detecting that a first switch has been pressed and released without holding for greater than a preset amount of time; and displaying a video of a next chapter of videos on the display screen upon detecting that the first switch has been pressed and released after holding for greater than the preset amount of time.

8. The method of claim 7, further comprising closing the cover panel, wherein based on the sensing element detecting a closing of the cover panel, video display is stopped.

\* \* \* \* \*

UNITED STATES PATENT AND TRADEMARK OFFICE
CERTIFICATE OF CORRECTION

PATENT NO. : 9,491,876 B2  
APPLICATION NO. : 13/758434  
DATED : November 8, 2016  
INVENTOR(S) : Richard L. Weber Page 1 of 1

It is certified that error appears in the above-identified patent and that said Letters Patent is hereby corrected as shown below:

On the Title Page

(73) Assignee: please change "Downington" to -- Downingtown --

Signed and Sealed this
Fourteenth Day of February, 2017

Michelle K. Lee
*Director of the United States Patent and Trademark Office*